US009437605B2

(12) United States Patent
Chen (10) Patent No.: US 9,437,605 B2
(45) Date of Patent: Sep. 6, 2016

(54) 3D NAND ARRAY ARCHITECTURE

(71) Applicant: Macronix International Co., Ltd., Hsinchu (TW)

(72) Inventor: Shih-Hung Chen, Jhudong (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/857,651

(22) Filed: Sep. 17, 2015

(65) Prior Publication Data

US 2016/0005748 A1    Jan. 7, 2016

Related U.S. Application Data

(63) Continuation-in-part of application No. 14/157,550, filed on Jan. 17, 2014, now Pat. No. 9,219,074, and a continuation-in-part of application No. 14/582,848, filed on Dec. 24, 2014, now Pat. No. 9,219,073, which (Continued)

(51) Int. Cl.
*H01L 27/115* (2006.01)
*H01L 27/02* (2006.01)

(52) U.S. Cl.
CPC ....... *H01L 27/1157* (2013.01); *H01L 27/0207* (2013.01); *H01L 27/11565* (2013.01); *H01L 27/11582* (2013.01)

(58) Field of Classification Search
None
See application file for complete search history.

(56) References Cited

U.S. PATENT DOCUMENTS

| 6,906,940 | B1 | 6/2005  | Lue             |
|-----------|----|---------|-----------------|
| 7,315,474 | B2 | 1/2008  | Lue             |
| 7,420,242 | B2 | 9/2008  | Lung            |
| 7,696,559 | B2 | 4/2010  | Arai et al.     |
| 7,778,073 | B2 | 8/2010  | Willer et al.   |
| 7,851,849 | B2 | 12/2010 | Kiyotoshi       |
| 8,008,732 | B2 | 8/2011  | Kiyotoshi et al.|
| 8,363,476 | B2 | 1/2013  | Lue et al.      |
| 8,467,219 | B2 | 6/2013  | Lue             |
| 8,503,213 | B2 | 8/2013  | Chen et al.     |

(Continued)

FOREIGN PATENT DOCUMENTS

EP    2048709 A2    4/2009
TW    102139597     10/2013

OTHER PUBLICATIONS

Lai, et al., "A Multi-Layer Stackable Thin-Film Transistor (TFT) NAND-Type Flash Memory," IEEE Int'l Electron Devices Meeting, Dec. 11-13, 2006, pp. 1-4.

(Continued)

*Primary Examiner* — Anthony Ho
*Assistant Examiner* — Kevin Quinto
(74) *Attorney, Agent, or Firm* — Haynes Beffel & Wolfeld LLP (57) ABSTRACT

Roughly described, a memory device has a multilevel stack of conductive layers which are divided laterally into word lines. Vertically oriented pillars each include series-connected memory cells at cross-points between the pillars and the layers. String select lines run above the conductive layers and define select gates of the pillars. Bit lines run above the SSLs. The pillars are arranged on a regular grid having a unit cell area α, and adjacent ones of the string select lines have respective widths in the bit line direction which are at least as large as (α/pBL). Ground select lines run below the conductive layers and define ground select gates of the pillars. The ground select lines, too, may have respective widths in the bit line direction which are at least as large as (α/pBL).

17 Claims, 9 Drawing Sheets

Related U.S. Application Data is a continuation-in-part of application No. 14/157,550, filed on Jan. 17, 2014, now Pat. No. 9,219,074, application No. 14/857,651, which is a continuation-in-part of application No. 14/582,963, filed on Dec. 24, 2012, now Pat. No. 9,373,632, which is a continuation-in-part of application No. 14/157,550, filed on Jan. 17, 2014, now Pat. No. 9,219,074, application No. 14/857,651, which is a continuation-in-part of application No. 14/640,869, filed on Mar. 6, 2015.

(56) References Cited

U.S. PATENT DOCUMENTS

| | | | |
|---|---|---|---|
| 8,648,438 | B2 | 2/2014 | Cai et al. |
| 8,759,899 | B1 | 6/2014 | Lue et al. |
| 8,785,319 | B2 | 7/2014 | Park et al. |
| 8,853,818 | B2 | 10/2014 | Lue |
| 9,142,538 | B1 | 9/2015 | Chen |
| 9,147,468 | B1 | 9/2015 | Lue |
| 9,219,073 | B2 | 12/2015 | Chen |
| 9,219,074 | B2 | 12/2015 | Chen |
| 2005/0280061 | A1 | 12/2005 | Lee |
| 2007/0045708 | A1 | 3/2007 | Lung |
| 2007/0158736 | A1 | 7/2007 | Arai et al. |
| 2007/0252201 | A1 | 11/2007 | Kito et al. |
| 2008/0073635 | A1 | 3/2008 | Kiyotoshi et al. |
| 2008/0175032 | A1 | 7/2008 | Tanaka et al. |
| 2008/0180994 | A1 | 7/2008 | Katsumata et al. |
| 2009/0097321 | A1 | 4/2009 | Kim et al. |
| 2009/0184360 | A1 | 7/2009 | Jin et al. |
| 2010/0270593 | A1 | 10/2010 | Lung et al. |
| 2011/0018051 | A1 | 1/2011 | Kim et al. |
| 2011/0286283 | A1* | 11/2011 | Lung ............ G11C 16/0483 365/185.28 |
| 2012/0068241 | A1 | 3/2012 | Sakuma et al. |
| 2012/0119283 | A1 | 5/2012 | Lee et al. |
| 2012/0182806 | A1 | 7/2012 | Chen et al. |
| 2013/0260559 | A1 | 10/2013 | Park et al. |
| 2015/0105639 | A1 | 4/2015 | Watanabe |
| 2015/0206896 | A1 | 7/2015 | Chen |
| 2015/0206898 | A1 | 7/2015 | Chen |
| 2015/0206899 | A1 | 7/2015 | Chen |
| 2015/0371998 | A1 | 12/2015 | Lue |

OTHER PUBLICATIONS

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Chen, Chih-Ping, et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012.91-92.

Lue, Hang-Ting, et al., "A highly scalable 8-layer 3D vertical-gate (VG) TFT NAND Flash using junction-free buried channel BE-SONOS device," 2010 Symposium on VLSI Technology (VLSIT), Jun. 15-17, 2010, 2 pages.

Kim, et al., "Three-Dimensional NAND Flash Architecture Design Based on Single-Crystalline STacked ARray," Electron Devices, IEEE Transactions on , vol. 59, No. 1, pp. 35,45, Jan. 2012.

Nowak, et al., "Intrinsic fluctuations in Vertical NAND flash memories," VLSI Technology (VLSIT), 2012 Symposium on , vol., No., pp. 21,22, Jun. 12-14, 2012.

Bae, JH, "Samsung's 3D V-NAND breaks through chip scaling limits", http://itersnews.com, dated Feb. 14, 2014, 5 pages.

Chen, et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012. 91-92.

Chen, et al., "Highly Scalable Vertical Gate 3-D NAND", 2012 IEEE International Electron Devices Meeting (IEDM), February 4, 2013, 9 pages.

Choi et al., "Performance Breakthrough in NOR Flash Memory With Dopant-Segregated Schottky-Barrier (DSSB) SONOS Devices," 2009 Symp. on VLSI Technology Jun. 16-18, 2009, Digest of Technical Papers, pp. 222-223.

Das, Arabinda, "Samsung 2x nm LPDDR3 DRAM Scales Memory Wall", EE Times, http://www.eetimes.com/author.asp?section id+36&eoc id+1321629&print=yes, dated Mar. 25, 2014, 6 pages.

Fukuzumi et al. "Optimal Integration and Characteristics of Vertical Array Devices for Ultra-High Density, Bit-Cost Scalable Flash Memory," IEEE Dec. 10-12, 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung, et al., "A highly scalable vertical gate (VG) 3D NAND Flash with robust program disturb immunity using a novel PN diode decoding structure," 2011 Symp, on VLSI Technology (VLSIT), Jun. 14-16, 2011, 2 pages.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

Katsumata, et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Komori, et al., "Disturbless Flash Memory due to High Boost Efficiency on BiCS Structure and Optimal Memory Film Stack for Ultra High Density Storage Device", Electron Devices Meeting, IEDM 2008, IEEE International, Dec. 15-17, 2008, San Francisco, California, 4 pages.

Lue, et al., "A highly scalable 8-layer 3D vertical-gate (VG) TFT NAND Flash using junction-free buried channel BE-SONOS device," 2010 Symposium on VLSI Technology (VLSIT), Jun. 15-17, 2010, 2 pages.

U.S. Appl. No. 14/637,187, filed Mar. 3, 2015, 90 pages.

U.S. Appl. No. 14/637,204 entitled "U-Shaped Vertical Thin-Channel Memory," by Hang-Ting Lue, filed Mar. 3, 2015, 78 pages.

Wang, Michael, "Technology Trends on 3D-NAND Flash Storage", Impact 2011, Taipei, dated Oct. 20, 2011, found at 222.impact.org.tw/2011/files/newsfile/201111110190.pdf.

\* cited by examiner

3D NAND ARRAY ARCHITECTURE

CROSS-REFERENCE TO OTHER APPLICATIONS

This application is a Continuation-In-Part of each of the following U.S. patent applications, all incorporated by reference herein:

U.S. application Ser. No. 14/157,550, filed 17 Jan. 2014, entitled THREE-DIMENSIONAL SEMICONDUCTOR DEVICE, incorporated by reference herein.

U.S. application Ser. No. 14/582,848, filed 24 Dec. 2014, entitled PARALLELOGRAM CELL DESIGN FOR HIGH SPEED VERTICAL CHANNEL 3D NAND MEMORY, by inventor Shih-Hung Chen, which is a Continuation-In-Part of the above-incorporated U.S. application Ser. No. 14/157,550, filed 17 Jan. 2014, entitled THREE-DIMENSIONAL SEMICONDUCTOR DEVICE;

U.S. application Ser. No. 14/582,963, filed 24 Dec. 2014, entitled TWISTED ARRAY DESIGN FOR HIGH SPEED VERTICAL CHANNEL 3D NAND MEMORY, by inventor Shih-Hung Chen, which is also a Continuation-In-Part of the above-incorporated U.S. application Ser. No. 14/157,550, filed 17 Jan. 2014, entitled THREE-DIMENSIONAL SEMICONDUCTOR DEVICE; and U.S. application Ser. No. 14/640,869, filed 6 Mar. 2015, entitled SEPARATED LOWER SELECT LINE IN 3D NAND ARCHITECTURE, by inventor Shih-Hung Chen.

BACKGROUND

1. Field of the Invention

The present invention relates to high density memory devices, and particularly to memory devices in which multiple planes of memory cells are arranged to provide a three-dimensional 3D array.

2. Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006, incorporated by reference herein.

Another structure that provides vertical NAND cells in a charge trapping memory technology is described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009, incorporated by reference herein. The structure described in Katsumata et al. includes a vertical NAND gate, using silicon-oxide-nitride-oxide-silicon SONOS charge trapping technology to create a storage site at each gate/vertical channel interface. The memory structure is based on a column of semiconductor material arranged as the vertical channel for the NAND gate, with a lower select gate adjacent the substrate, and an upper select gate on top. A plurality of horizontal word lines is formed using planar word line layers that intersect with the columns, forming a so-called gate all around cell at each layer.

Figure 1:
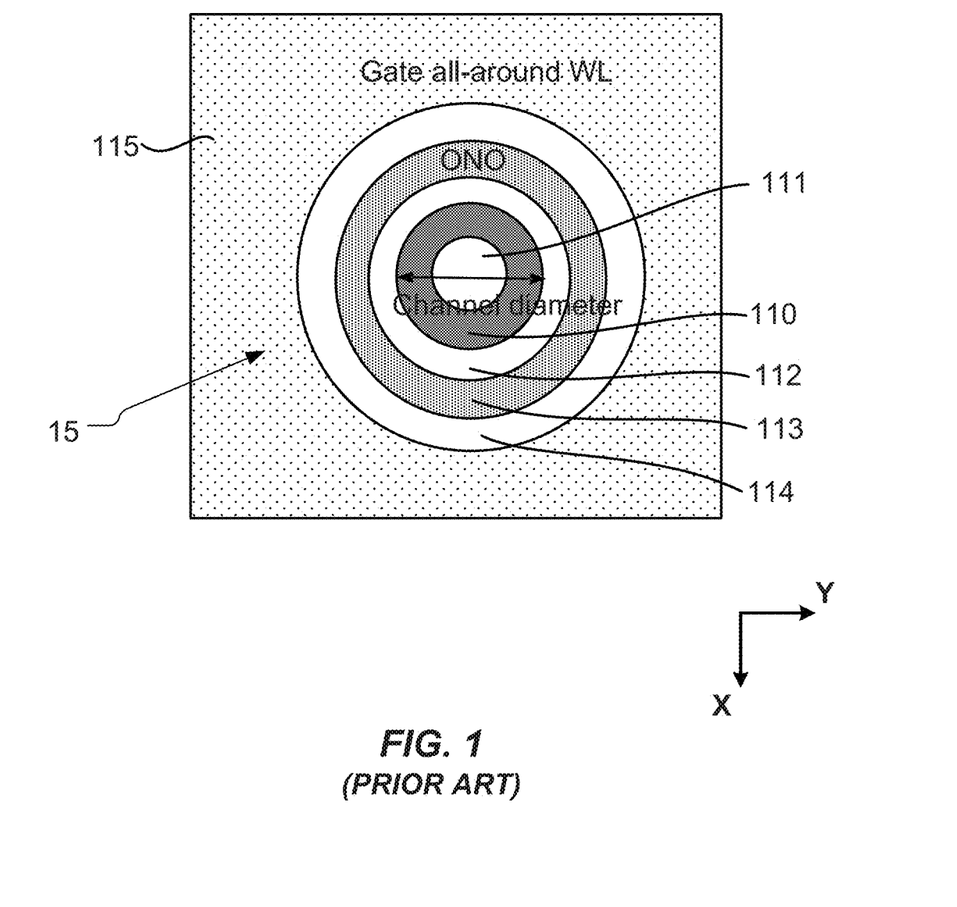
FIG. 1 illustrates a horizontal cross-section of a column of a pipe-shaped BiCS flash cell.

FIG. 1 is a horizontal cross-section of a column of a pipe-shaped BiCS flash cells, such as described in the Katsumata et al. publication, at the level of a word line. The structure includes a pillar 15 having a center core 110 of semiconductor material which extends vertically through a stack of word line layers. The core 110 may have a seam 111 through the middle that arises from the deposition technique. A dielectric charge trapping structure comprising for example a first layer 112 of silicon oxide, a layer 113 of silicon nitride and a second layer 114 of silicon oxide (referred to as ONO), or another multilayer dielectric charge trapping structure surrounds the core 110. A gate all-around word line is intersected by the pillar. A frustum of the pillar at each layer combines with the gate all-around word line structure at that layer, to form a memory cell.

Figure 2:
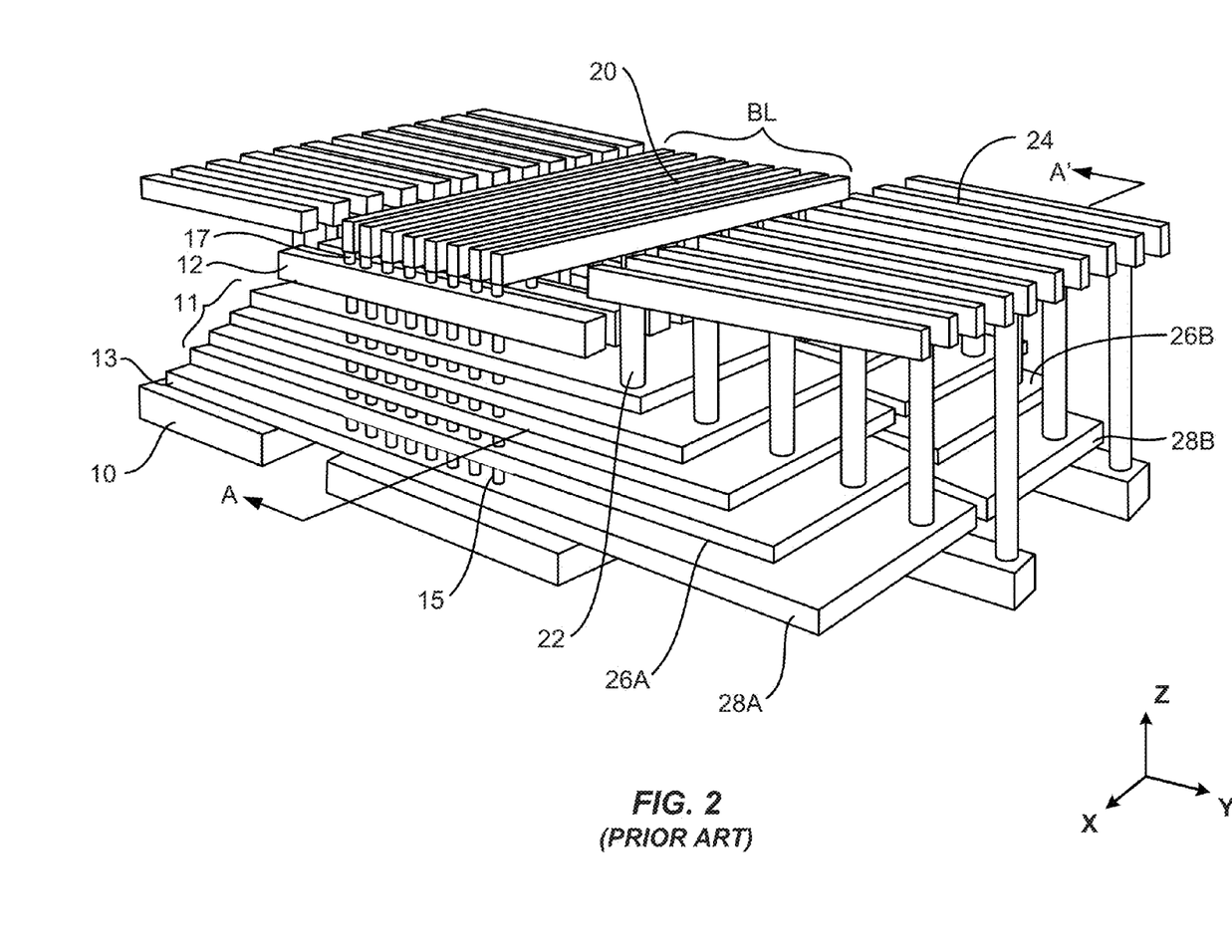
FIG. 2 is a perspective view of a 3D semiconductor device.

FIG. 2 is a perspective view of a 3D semiconductor device. It comprises a multilevel stack of word line conductive layers 11, each parallel to the substrate (not shown); a plurality of pillars 15 oriented orthogonally to the substrate, each of the pillars comprising a plurality of series-connected memory cells located at cross-points between the pillars and the conductive layers; and a plurality of string select lines (SSLs) 12 oriented parallel to the substrate and above the conductive layers 11, each of the string select lines intersecting a respective row of the pillars. Each intersection of a pillar and a string select line defines a string select gate (SSG) of the pillar. The structure also includes ground select lines (GSL) 13 (also sometimes called lower select lines especially in embodiments, like FIG. 2, where they are located at the lower end of a pillar) oriented parallel to the substrate and forming a layer below the word line conductive layers 11. Each intersection of a pillar and a ground select line 13 defines a ground select gate (GSG) (also sometimes called a lower select gate (LSG) of the pillar. A common source line (CSL) 10 is formed in a layer parallel to the substrate and below the GSLs. The structure also includes a plurality of parallel bit line conductors 20 in a layer parallel to the substrate and above the string select lines. Each of the bit line conductors superposes a respective column of the pillars, and each of the pillars underlies one of the bit line conductors. The pillars may be constructed as described above with respect to FIG. 1.

The illustration of FIG. 2 shows two blocks of memory cells laterally, due to the lateral split between two portions 26A and 26B of the word line conductive layers 11. For example, word line 26A defines one block of memory cells, whereas word line 26B defines a second block of memory cells. Similarly, the illustration shows two corresponding ground select lines 28A and 28B.

Figure 3:
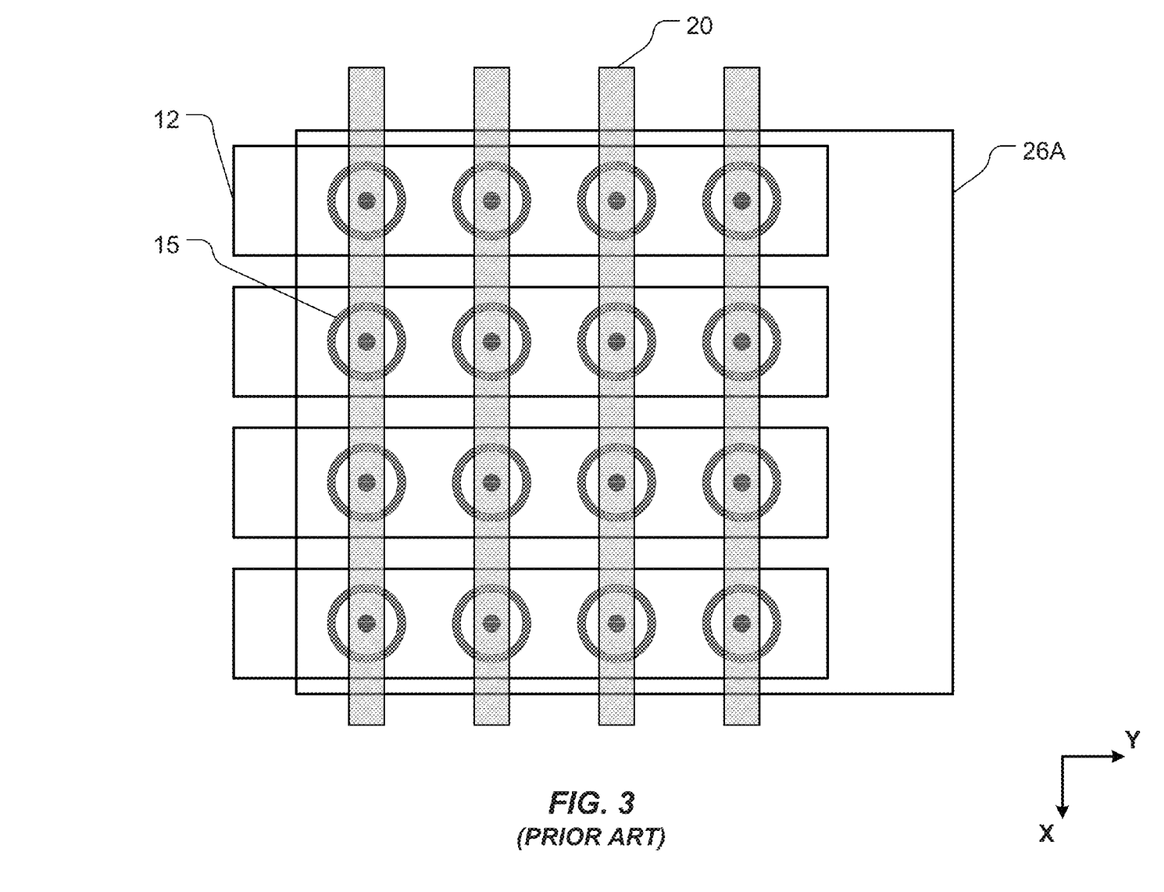
FIG. 3 is a top view of a portion of the structure of FIG. 2.

FIG. 3 is a top view of a portion of the structure of FIG. 2. As can be seen, a word line such as 26A intersects only some of the pillars in the overall structure; each word line 26A or 26B defines a block of memory cells. Thus to read data from a particular block of the memory, control circuitry activates a word line 26A, 26B to select a block of cells and a particular layer of the stack, and further activates a string select line 12 to select a particular row. A ground select gate is activated as well. A row of cells is then read out in parallel via the bit line conductors 20 into a page buffer (not shown). ("Activate", as used herein, means to apply a particular bias so as to give effect to the connected cells or switches. The bias may be high or low, depending on the memory design.) Depending on the product specification and design, the page buffer may hold two or more rows of data, in which case a full page read operation would involve successive activation of two or more SSLs 12.

Figure 4:
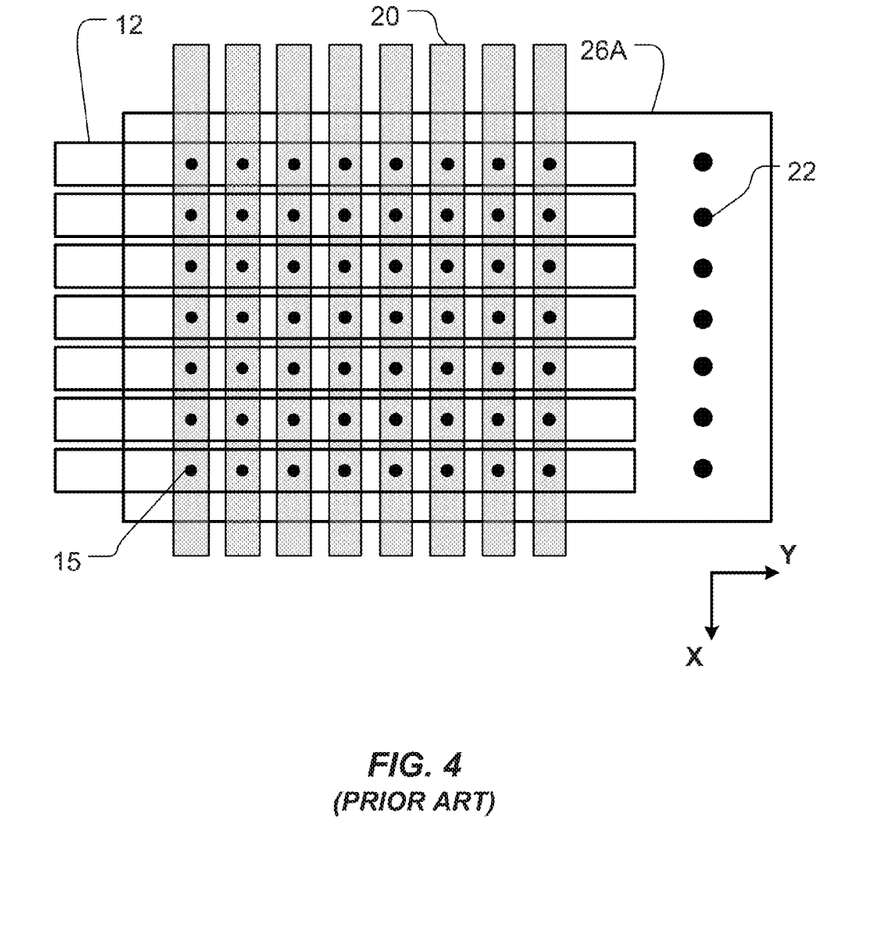
FIG. 4 is a top view of a portion of the structure of FIG. 2, scaled down to permit more bit lines and SSLs.

While 3D stacking memory structures hold the promise of greatly increased memory density, they also introduce significant process challenges because, among other things, of the need to etch very deep holes through many layers. Such deep holes have to be made wider, and have to be placed at greater center-to-center distance from each other laterally, in order to meet process windows. As fabrication processes improve, capacity may be increased not only by increasing the number of word line planes in the stack, but also by reducing the spacing between the pillars. FIG. 4 is a top view of a scaled down structure in which both the number of bit lines 20 in a block and the number of SSLs 12 in the block have been increased. Not only does the cost decrease, but increased read/write data rate can be achieved as well because the larger number of bit lines 20 means increased parallel operation. On the other hand, the increased number of SSLs 12 means more cells will suffer Vpass disturb due to word line select. Unit cell capacitance also increases with the number of SSLs 12, thereby increasing power consumption and slowing device operation.

Increasing bit density by increasing the number of word line conductive layers 11 in the stack also has downsides, even aside from the expected process challenges of increased numbers of layers. In FIG. 2 it can be seen that a typical arrangement has a stepped contact structure to the word line conductive layers 11. Deep etches are made through the structure in order to form contacts 22 to connect the conductive layers 11 to metal interconnects 24 above. These contacts 22 are also shown symbolically in the top view of FIG. 4. In a typical design, the number of rows of pillars 15 in a block is at least as great as the number of contacts 22, and hence memory layers. See, for example, Komori, Y., et al., "Disturbless flash memory due to high boost efficiency on BiCS structure and optimal memory film stack for ultra high density storage device," Electron Devices Meeting, 2008, IEDM 2008, IEEE International, vol., no., pp. 1-4, 15-17 (December 2008) at 2, incorporated herein by reference. Thus increasing the number of memory layers also increases the number of SSLs 12, and again increases power consumption and slows device operation.

An opportunity therefore arises to create robust solutions to the problem of increasing bit density of 3D memory structures while reducing the negative impacts that such increases tend to cause. Better chip yields, and denser, and more powerful circuits, components and systems may result.

SUMMARY

Roughly described, a memory device has a multilevel stack of conductive layers which are divided laterally into word lines. Vertically oriented pillars each include series-connected memory cells at cross-points between the pillars and the layers. String select lines run above the conductive layers and define select gates of the pillars. Bit lines run above the SSLs. The pillars are arranged on a regular grid having a unit cell area a, and adjacent ones of the string select lines have respective widths in the bit line direction which are at least as large as ($\alpha$/pBL). Ground select lines run below the conductive layers and define ground select gates of the pillars. The ground select lines, too, may have respective widths in the bit line direction which are at least as large as ($\alpha$/pBL).

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The invention will be described with respect to specific embodiments thereof, and reference will be made to the drawings, in which.

DETAILED DESCRIPTION

One solution to the problem of increasing bit density of 3D memory structures while reducing the negative impacts that such increases tend to cause, was discussed in the above-incorporated TWISTED ARRAY patent application. As described in more detail therein, in a memory device having a multilevel stack of conductive layers oriented parallel to a substrate, pillars oriented orthogonally to the substrate each include series-connected memory cells at cross-points between the pillars and the conductive layers. String select lines (SSLs) are disposed above the conductive layers, each intersection of a pillar and an SSL defining a respective select gate of the pillar. Bit lines are disposed above the string select lines. The pillars in the plurality of pillars are arranged on a regular grid which is rotated relative to the bit line conductors. The grid may have a square, rectangle or diamond-shaped unit cell, and may be rotated relative to the bit lines by an angle $\theta$ where $\tan(\theta)=\pm X/Y$, where X and Y are co-prime integers. The SSLs may be made wide enough so as to intersect two pillars on one side of the unit cell, or all pillars of the cell, or sufficiently wide as to intersect pillars in two or more non-adjacent cells. The rotation permits a higher density of bit lines, thereby enabling a higher data rate due to increased parallel operation. It also enables a smaller number of SSLs, thereby reducing read disturbance, reducing power consumption and further improving data rate by reducing unit cell capacitance.

Another solution to the above problem was discussed in the above-incorporated PARALLELOGRAM CELL patent application. As described in more detail therein, instead of being arranged on a rotated grid, the pillars in the plurality of pillars are arranged on a regular grid having a unit cell which is a non-rectangular parallelogram. The pillars may be arranged so as to define a number of parallel pillar lines, the pillar lines having an acute angle θ>0° of intersection with the bit line conductors, each line of pillars having exactly n>1 pillars all intersecting a particular common one of the string select lines. As with the twisted array design, the parallelogram array design also permits a higher density of bit lines, thereby enabling a higher data rate due to increased parallel operation. It also enables a smaller number of SSLs, thereby reducing disturbance, reducing power consumption and further improving data rate by reducing unit cell capacitance.

In both of the above solutions, the described benefits are obtained in part because the SSLs can be made significantly wider in the bit line dimension than in conventional arrays. There are limits, however, because the intersections between an SSL and a bit line should uniquely define exactly one of the pillars. If the SSLs are too wide in the bit line direction, then more than one pillar underlying a single bit line may also underlie the SSL, thereby creating an addressing conflict. If the SSLs are too narrow in the bit line direction, then some bit lines may cross the SSL without intersecting any of the pillars.

Figure 5:
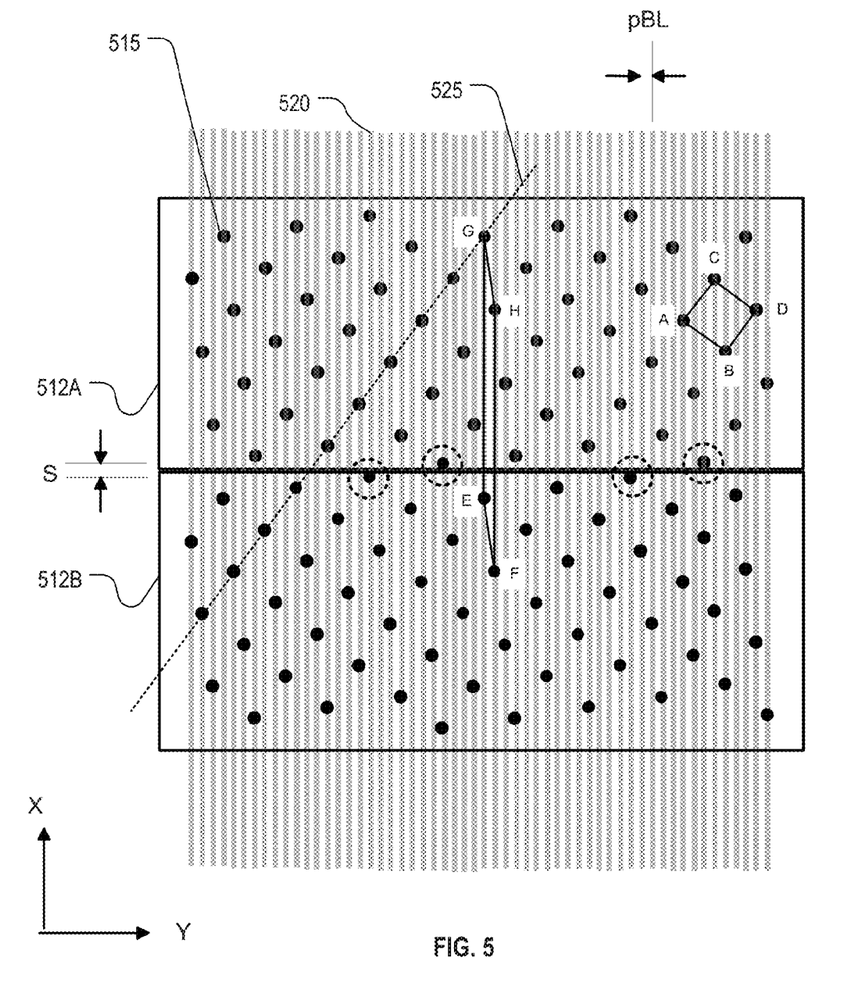
FIG. 5 illustrates a portion of a rotated array as in the above TWISTED ARRAY patent application, showing two adjacent SSLs.

In order to satisfy these restrictions, process windows may need to be made very narrow. FIG. 5 illustrates a portion of a rotated array as in the above TWISTED ARRAY patent application. A sufficiently large region of the array is shown so as to encompass the width in the bit line direction of two adjacent SSLs 512A and 512B (representatively 512). In the drawing, the bit lines are identified as 520 and the pillars as 515. It can be seen that depending on the angle at which the array is rotated relative to the bit line direction, it may occur that some pillars may be very close to the edge of the SSLs. See the pillars in FIG. 5 which are circled with broken lines, for example.

Figure 6:
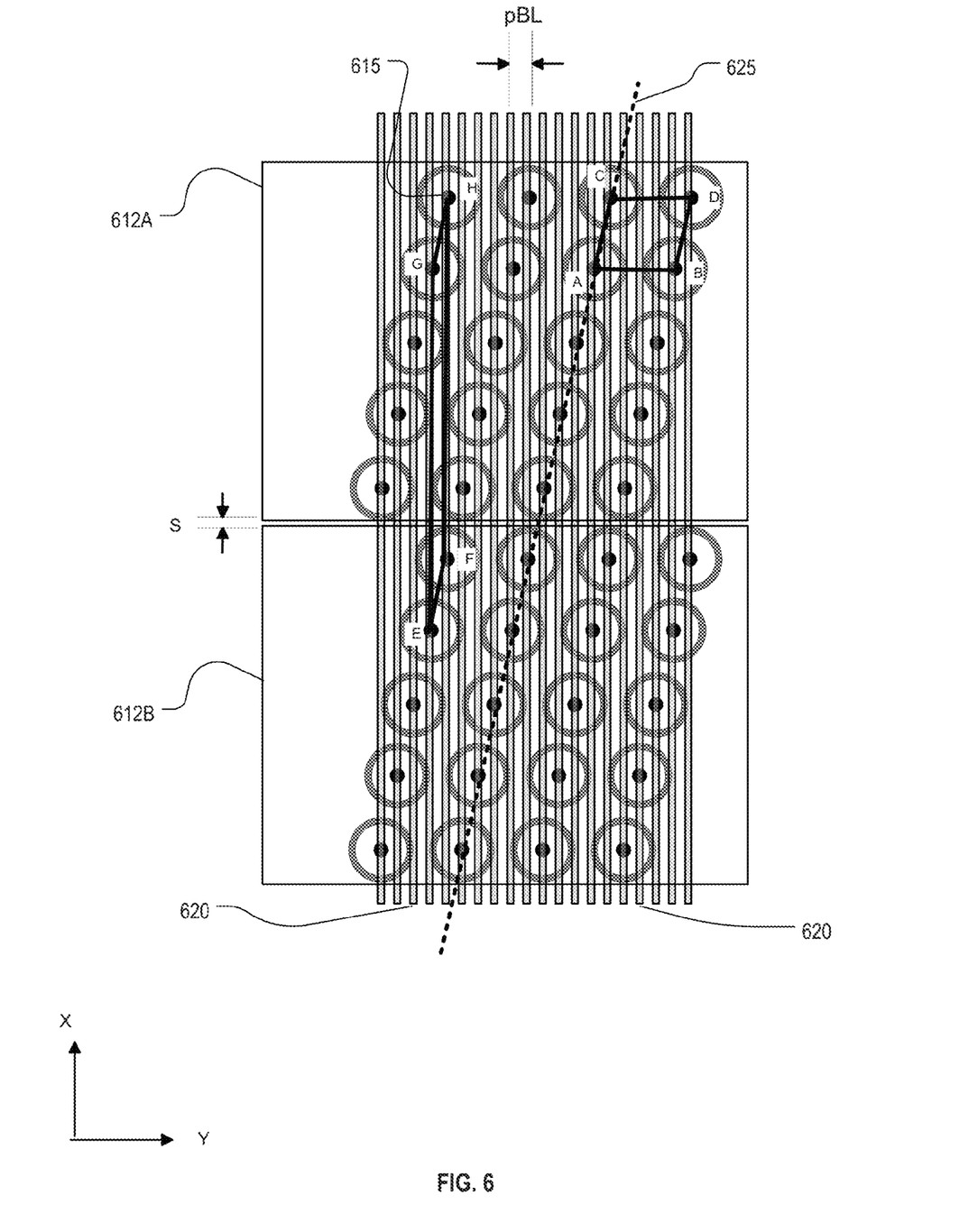
FIG. 6 illustrates a portion of a parallelogram array as in the above PARALLELOGRAM CELL DESIGN patent application, also showing two adjacent SSLs.

Similarly, FIG. 6 illustrates a portion of a parallelogram array as in the above PARALLELOGRAM CELL DESIGN patent application. A sufficiently large region of the array is shown so as to encompass the width in the bit line direction of two adjacent SSLs 612A and 612B (representatively 612). In the drawing, the bit lines are identified as 620 and the pillars as 615. It can be seen that in this design as well, it may occur that some pillars may be very close to the edge of the SSLs. See the pillars in FIG. 6 which are adjacent to the boundary between the two SSLs 612 shown.

In both the FIG. 5 and FIG. 6 arrangements, the spacing between the two adjacent SSLs in the bit line direction may be very small, making the SSL process window very narrow. Additionally, in both examples, the pillars that are adjacent to the edges of the SSLs may also have a very limited process window, and may not have enough space in the bit line direction to form the surrounding gate.

Before describing solutions to this problem, it will be helpful to establish certain definitions As used herein, "lateral" dimensions refer to dimensions of the structure which are parallel to the substrate. For example, the dimensions labeled X and Y in FIG. 2 are considered "lateral" dimensions herein, whereas the dimension labeled Z is sometimes referred to as a "vertical" dimension. In addition, layers which are termed "above" or "below" other layers, can in various embodiments be separated from such other layers by one or more intervening layers. If no intervening layer is intended, then the terms "immediately above" or "immediately below" are used herein. The same interpretation is intended for layers described as "superposing", "underlying" or "over" another layer.

Also, as used herein, two items are "adjacent" to each other if they are not separated by another item of the same type. For example, two SSLs are considered "adjacent" to each other if there is no intervening SSL between them, even if the two SSLs do not touch each other. Immediate adjacency is not required by the term "adjacent" unless called for explicitly.

Further, in the twisted array arrangement of FIG. 5, it can be seen that the pillars 515 in the array pillars are arranged on a regular grid having two lateral dimensions X and Y. The X dimension is parallel to the bit line conductors, and the Y dimension is orthogonal to the bit line conductors. As used herein, a "regular grid" or "regular array" is a grid (array) which can be divided into adjacent unit cells which collectively fill the array, and all of which have the same shape and size. In FIG. 5 an example unit cell is shown as square ABDC. While the grid itself has numerous pillars, the boundaries of the grid, as the term "grid" is used herein, need not have any regularity in a particular embodiment.

Similarly, in the parallelogram arrangement of FIG. 6, it can be seen that the pillars 615 in the array pillars are arranged on a similar regular grid having two lateral dimensions X and Y. In FIG. 6 an example unit cell is shown as parallelogram ABDC.

For both the parallelogram and twisted array arrangements, as used herein, a "unit cell" in a regular grid is defined as a parallelogram ABDC whose four vertices are located at four pillars of the grid, where pillars A, B, C and D are defined by starting with a pillar A, then choosing as pillar B a pillar in the grid which is "nearest" to pillar A, then choosing as pillar C a pillar in the grid which is non-collinear with pillars A and B but which is otherwise "nearest" pillar A in the grid, then choosing pillar D as the pillar located at the fourth vertex of the parallelogram. In both the FIG. 5 arrangement and the FIG. 6 arrangement, every unit cell has at least one side which is parallel to neither the X nor Y axis. As used herein, unless otherwise stated, the "distance" between pillars refers to the Euclidean center-to-center distance between the pillars. In addition, the "distance in a particular dimension" between two pillars, as used herein, is the difference between the coordinates of the two pillars in that dimension; ignoring the coordinates in the other dimensions. For example, in FIG. 5, if the distance between pillars A and B is d, then the distance between pillars A and C is also d. The "distance" (i.e. Euclidean distance) between pillars B and C is $d\sqrt{2}$, but the "distance in the Y dimension" between pillars B and C is the same as the pitch of the bit lines, pBL. Also as used herein, the "nearest" pillar to a given pillar is a pillar having the shortest distance to the given pillar. If more than one pillar has the same shortest distance to the given pillar, then any one of them qualifies as being the pillar "nearest" to the given pillar.

In the grid of FIG. 5, unit cell ABDC is a square. As used herein, the term "square" is a special case of the term "rectangle", in that a square is a rectangle whose four sides all have equal length. Similarly, a "square" is also a special case of a "rhombus", in that a square is also a rhombus whose four angles are right angles. Furthermore, squares, rectangles and rhombuses are all special cases of the term "parallelogram". A rectangle is a parallelogram whose four angles are right angles; a rhombus is a parallelogram whose four sides have equal length, and a square is a parallelogram whose four angles are right angles and whose four sides have equal length. Thus the square ABDC in FIG. 5 can equally be called a rhombus, a rectangle, and a parallelogram.

In FIG. 5, another parallelogram EFHG is also shown. Parallelogram EFHG is chosen by starting with a pillar E, then choosing as pillar F a pillar on the grid which is nearest pillar E but on an adjacent bit line, then choosing pillar G as a pillar which is nearest pillar E but on the same bit line as pillar E, then choosing pillar H as the fourth vertex of the parallelogram. Thus two opposite ones of the parallelogram EFHG lie on adjacent bit lines. It can be shown that the area of unit cell EFHG is the same as the area of unit cell ABDC. It can be seen further that, since line segment EG lies on a bit line, and its endpoints coincide with pillars, SSLs 512 are narrow enough in the bit line direction such that points E and G lie in different SSLs 512 in order to avoid an addressing conflict. The same is true for line segment FH. Since the area of the cell is given by the length of EG (or FH) times the distance in the Y dimension between vertices E and F (or G and H), which is pBL, it can be seen that in the arrangement of FIG. 5, the width of the SSL 512 in the bit line direction has to be less than α/pBL in order to avoid an addressing conflict, where α is the area of the unit cell.

Similarly, in FIG. 6, a parallelogram EFHG is shown. The parallelogram EFHG in FIG. 6 is defined using the same procedure as set forth above with respect to the parallelogram EFHG in FIG. 5. As for FIG. 5, two opposite ones of parallelogram EFHG lie on adjacent bit lines. Again, it can be shown that the area of unit cell EFHG is the same as the area of unit cell ABDC in FIG. 6. It can be seen further that, since line segment EG lies on a bit line, and its endpoints coincide with pillars, SSLs 612 are narrow enough in the bit line direction such that points E and G lie in different SSLs 612 in order to avoid an addressing conflict. The same is true for line segment FH. Since the area of the cell is given by the length of EG (or FH) times the distance in the Y dimension between vertices E and F (or G and H), which is pBL, it can be seen that in the arrangement of FIG. 6, the width of the SSL 612 in the bit line direction has to be less than α/pBL in order to avoid an addressing conflict, where α is the area of the unit cell.

Figure 7:
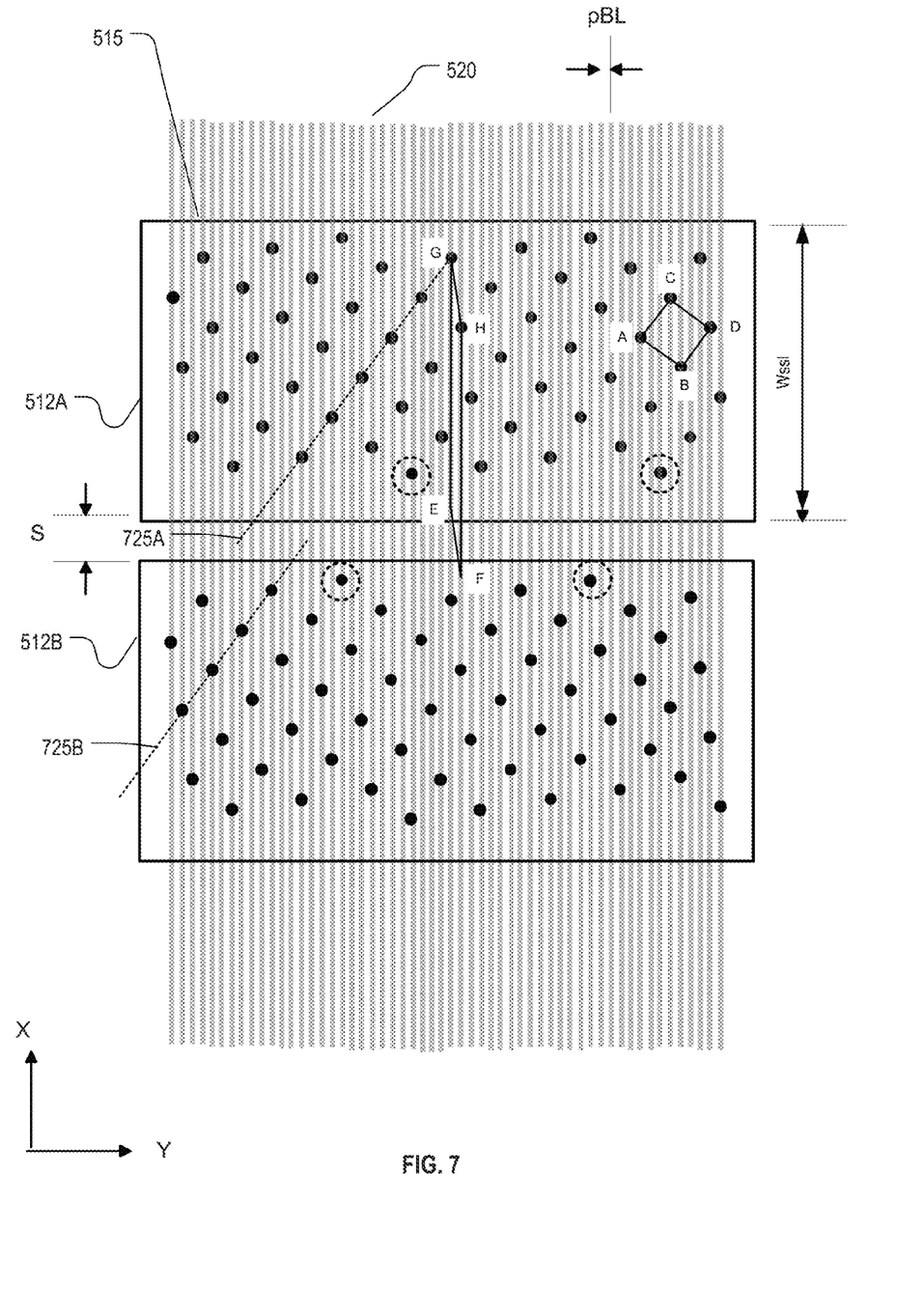
FIG. 7 illustrates the array portion of FIG. 5, after pillars have been pulled away.

Given the above definitions, FIG. 7 illustrates a solution to the above process window problems, based on the twisted array arrangement of FIG. 5. As can be seen, the portions of the pillar array that underlie adjacent SSLs 512 have been "pulled away" from each other. In particular, given a side of a unit cell which is not parallel or perpendicular to the bit line direction, if a line is drawn to parallel that side, such a line may no longer intersect pillars underlying both of two adjacent SSLs. For example, in FIG. 5, it can be seen that dotted line 525 parallels side AC of unit cell ABDC. Side AC is not parallel or perpendicular to the bit line direction. This line 525 intersects pillars underlying both SSLs 512. In the FIG. 7 embodiment, after the array portions have been pulled away, whereas the same dotted line (725A in FIG. 7) intersects pillars that underlie SSL 512A, it no longer intersects pillars that underlie SSL 512B. Instead, the same pillars now underlie a different line 725B having the same angle to the bit lines as line 725A. Said differently, line 525 has been broken or shifted, between the SSLs 512A and 512B. Said yet another way, the portion of line 525 that intersects pillars underlying SSL 512B "no longer aligns with" the portion of line 525 that intersects pillars underlying SSL 512A. In addition, in the embodiment of FIG. 7, it can be seen that unlike the arrangement of FIG. 5, the width Wssl of the SSLs 712 in the bit line direction is greater than α/pBL, where α is the area of the unit cell. As mentioned with respect to FIG. 5, without the "pulling away", SSLs having such a width would cause an addressing conflict.

Figure 8:
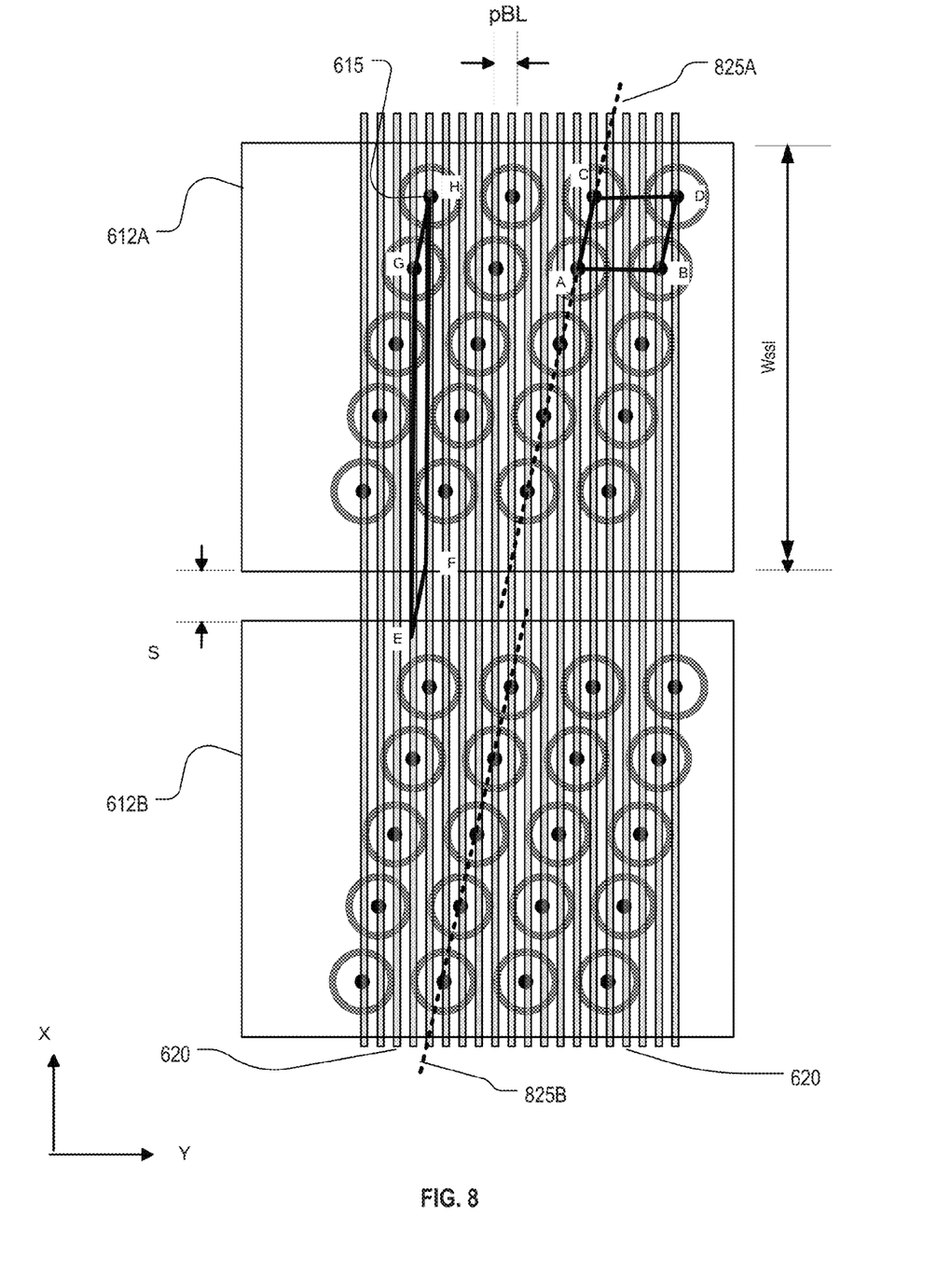
FIG. 8 illustrates the array portion of FIG. 6, after pillars have been pulled away.

Similarly, FIG. 8 illustrates a solution to the above process window problems, based on the parallelogram array arrangement of FIG. 6. As can be seen, the portions of the pillar array that underlie adjacent SSLs 612 have been "pulled away" from each other. In particular, given a side of a unit cell which is not parallel or perpendicular to the bit line direction, if a line is drawn to parallel that side, such a line may no longer intersect pillars underlying both of two adjacent SSLs. For example, in FIG. 6, it can be seen that dotted line 625 parallels side AC of unit cell ABDC. Side AC is not parallel or perpendicular to the bit line direction. This line 625 intersects pillars underlying both SSLs 612A and 612B. In the FIG. 8 embodiment, after the array portions have been pulled away, whereas the same dotted line (825A in FIG. 8) intersects pillars that underlie SSL 612A, it no longer intersects pillars that underlie SSL 612B. Instead, the same pillars now underlie a different line 825B having the same angle to the bit lines as line 825A. Said differently, line 625 has been broken or shifted, between SSLs 612A and 612B. Said yet another way, the portion of line 625 that intersects pillars underlying SSL 612B "no longer aligns with" the portion of line 625 that intersects pillars underlying SSL 612A. In addition, in the embodiment of FIG. 8, it can be seen that unlike the arrangement of FIG. 6, the width Wssl of the SSLs 812 in the bit line direction is greater than α/pBL, where α is the area of the unit cell. As mentioned with respect to FIG. 6, without the "pulling away", SSLs having such a width would cause an addressing conflict.

By pulling away the array portions, the spacing S between adjacent SSLs in the bit line direction can be increased, thereby relaxing the process window for S. Preferably the spacing S is chosen to be about equal to half the center-to-center spacing of the pillars. In addition, the SSL widths Wssl in the bit line direction has been enlarged as well, thereby also relaxing the process window for gate material surrounding the pillars that are adjacent to the edges of the SSLs. Preferably the SSLs extend beyond the edge pillar centers in the bit line direction by around half the center-to-center spacing of the pillars. Note that whereas it is preferred that all SSLs have the same width in the bit line direction, this is not a requirement for all embodiments.

Note that as used herein with respect to a "pulled away" embodiment such as those shown in FIGS. 7 and 8, the "unit cell" is defined only among those pillars that underlie a single SSL. The definition of the term does not include a parallelogram that spans the gap between two SSLs.

In the embodiments of FIGS. 7 and 8, it is preferred that the SSL widths Wssl in the bit line direction are large compared to the bit line pitch pBL. In particular, because of process window considerations, the unit cell of a 3D array typically must be larger than the unit cell of a conventional 2D array. Typically the spacing between pillars (inter-pillar pitch) needs to be about 5 times as large for the 3D array than the 2D array, in order to allow a sufficiently large process window for the deep etches that are used. To achieve the same density of bit lines, therefore, a twisted array or parallelogram array arrangement can be used which increases the bit line density by a factor of at least 5 (reduces pBL by a factor of at least 5). The SSLs that overly each group of 5 bit lines thus can have a width in the bit line direction of about 5 times the inter-pillar pitch, plus around one more inter-pillar pitch distance to allow an extra window for edge pillars, resulting in a width in the bit line direction of around 6 times the inter-pillar pitch, or 6*5=30 times the bit line pitch. That is, Wssl≥30*pBL. If the array twisted array or parallelogram array is designed to increase the bit line density by a factor of more than 5 (reduces pBL by a factor of more than 5), then Wssl can be correspondingly larger.

Similarly, in the embodiments of FIGS. 7 and 8 it is also preferred that the spacing S between SSLs be as narrow as reasonably practical, while still allowing a sufficiently large process window. Typically a spacing S equal to about half the inter-pillar pitch is a good compromise. If the SSL width Wssl in the bit line direction is 6 times the inter-pillar pitch, as above, then the ratio of SSL width to the spacing S will be around Wssl/S=6/(0.5)=12. If the array twisted array or parallelogram array is designed to increase the bit line density by a factor of more than 5 (permitting SSL width Wssl in the bit line direction of more than 6 times the inter-pillar pitch), then assuming S is still equal to about half the inter-pillar pitch, the ratio of SSL width to the spacing S will then be Wssl/S>=12. Summarizing, therefore, it is preferred that Wssl≥12*S.

GSL Width and Spacing Considerations

In the conventional arrangement of FIG. 2, the ground select lines 13 have approximately the same width in the bit line direction as the word line conductive layers 11. That is, there is one GSL per block. As a result, when the lower select gate is activated in order to activate a row of memory cells, that same action also activates the lower select gates of all the other memory cells of the block. Thus unselected pillars sharing the activated lower select line are connected to the source, further exacerbating the problem of Vpass disturb.

A solution to this problem is described in the above-incorporated SEPARATED LOWER SELECT LINE patent application. Roughly described, it provides a memory device similar to that of FIG. 2, except that the ground select lines are split such that the number of ground select lines underlying each of the word select lines is greater than 1 but less than the number of string select lines overlying the same word select line. The technology permits a designer to trade off density in the bit line direction in favor of reduced Vpass disturb, by varying the number of separate ground select lines per block in different embodiments.

Like the SSLs, GSLs too can benefit from a "pulling away" of the portions of the pillar array that overlie adjacent GSLs. All of the same considerations and variations as set forth above with respect to the pulling away of SSLs apply as well to separated GSLs. In addition, the technique can be used for both SSLs and GSLs together in a single embodiment.

Figure 9:
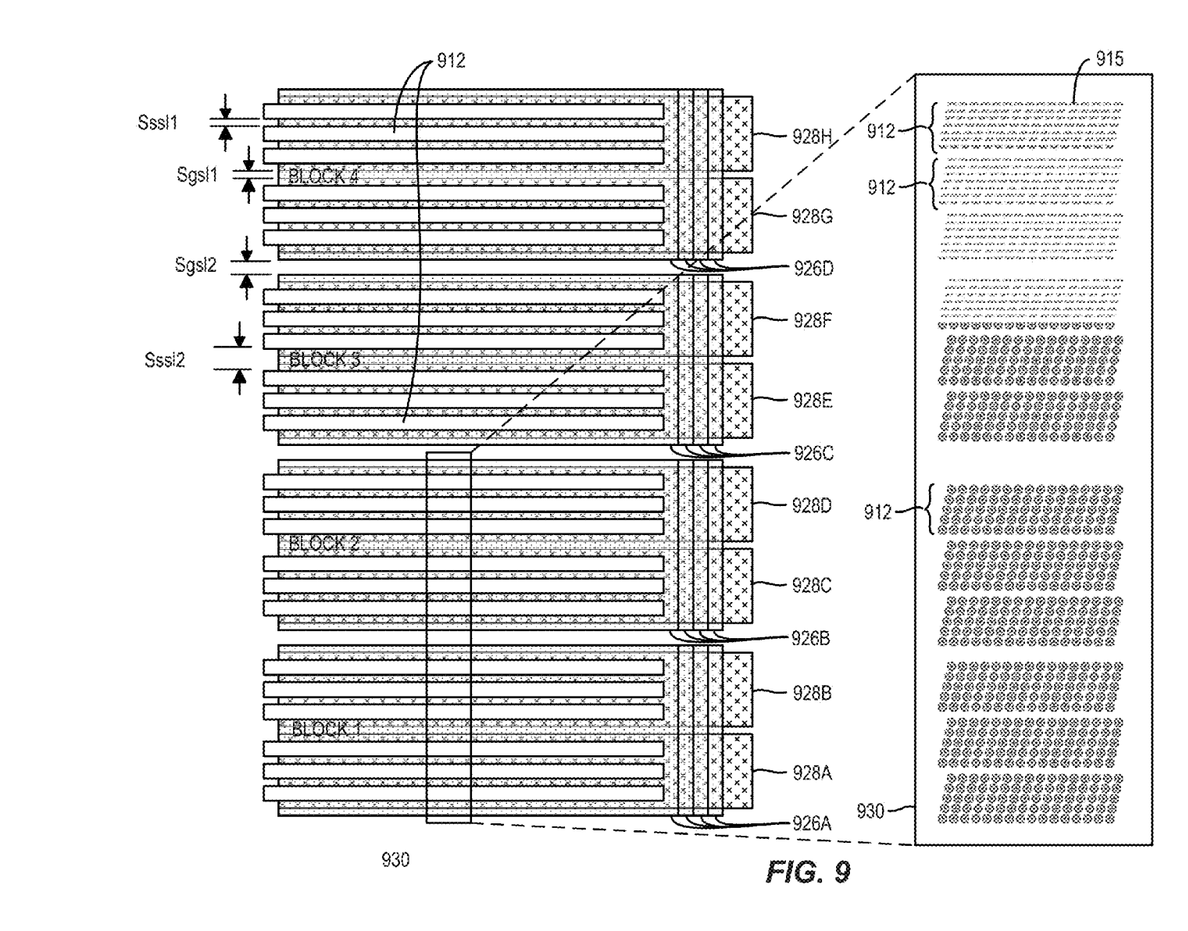
FIG. 9 illustrates use of parallelogram pillar arrangement where pillars of adjacent SSLs and pillars of adjacent GSLs both have been pulled away from each other.

FIG. 9 illustrates use of parallelogram pillar arrangement of FIG. 6 to increase the density of bit lines and reduce the density of SSLs, but the twisted array arrangement of FIG. 5 could be used instead. The left side of FIG. 9 is a top view of a portion of a memory array. Four blocks of cells are shown: block 1 is defined by word lines 926A, block 2 is defined by word lines 926B, block 3 is defined by word lines 926C, and block 4 is defined by word lines 926D (collectively 926). Each block contains $N_{GSL}=2$ ground select lines underlying each of the word lines and spaced from each other in the bit line direction. Specifically block 1 contains GSLs 928A and 928B, block 2 contains GSLs 928C and 928D, block 3 contains GSLs 928E and 928F, and block 4 contains GSLs 928G and 928H (collectively 928). Each GSL 928 underlies $N_{SSLG}=3$ SSLs 912. On the right hand side of FIG. 9 is an enlargement of a region 930, showing only a strip in the bit line direction of blocks 1 and 2. The individual pillars 915, in parallelogram arrangement, are visible in the enlargement. Note that in general, $N_{GSL}$ can be any integer greater than 0, and $N_{SSLG}$ can be any integer greater than 0 in various embodiments.

It can be seen that the pillars underlying adjacent SSLs 912 which overly a single one of the GSLs 928 have been pulled away from each other as described above with respect to FIGS. 7 and 8. In addition, the pillars overlying adjacent GSLs 928 have been pulled away from each other in the same manner. In FIG. 9, the spacing between adjacent SSLs 912 which both overly a single one of the GSLs 928 is designated Sssl1, whereas the spacing between two adjacent GSLs which share a single block is designated Sgsl1. The spacing between adjacent SSLs 912 which straddle a gap between two GSLs 928, both of which share a single block, is designated Sssl2, and the spacing between adjacent GSLs 928 which straddle a gap between two blocks is designated Sgsl2. It can be seen that the Sgsl1 can be roughly the same as Sssl1, and Sssl2>Sssl1.

Specifically with respect to adjacent GSLs 928 that both share a single block, after the array portions have been pulled away, a line similar to dotted line 825A in FIG. 8 (not shown in FIG. 9) intersects pillars that overlie GSL 928A no longer intersects pillars that overlie GSL 928B, as it would have without any pulling away. Instead, the same pillars now overlie a different line similar to 825B in FIG. 8 (not shown in FIG. 9) having the same angle to the bit lines. Said differently, the line that intersected pillars overlying both GSLs 928A and 928B has been broken or shifted, between GSLs 928A and 928B. Said yet another way, the portion of the line that intersects pillars overlying both GSLs 928B "no longer aligns with" the portion of the line that intersects pillars underlying GSL 928A. In addition, in the embodiment of FIG. 9, the width Wgsl in the bit line direction of one of the GSLs 928 is greater than α/pBL, where α is the area of the unit cell of the pillars that overlie that GSL. Similarly to the SSLs, without the "pulling away" of pillar arrays overlying adjacent GSLs 928, GSLs having such a width would cause an addressing conflict.

By pulling away the array portions, the spacing Sgsl1 between adjacent GSLs in the bit line direction can be increased, thereby relaxing the process window for Sgsl. Preferably the spacing Sgsl1 is chosen to be about equal to half the center-to-center spacing of the pillars. In addition, the GSL widths Wgsl in the bit line direction has been enlarged as well, thereby also relaxing the process window for gate material surrounding the pillars that are adjacent to the edges of the GSLs. Preferably the GSLs extend beyond the edge pillar centers in the bit line direction by around half the center-to-center spacing of the pillars.

As mentioned above, it is preferred that $W_{SSL}/pBL>30$ and $W_{SSL}/S>12$. For the GSLs, a larger $W_{GSL}$ can increase memory density. This can be seen because, referring to FIG. 9 as an illustration, the spacing Sssl2 between adjacent SSLs which span a gap between GSLs is larger than the spacing Sssl1 which does not span a gap between GSLs. Thus memory density increases if there are fewer gaps between GSLs, which means more SSLs overlying each GSL. On the other hand, challenges can result in program disturb if too many SSLs overlie each GSL. A good compromise between these competing considerations is that $W_{GSL}>2*W_{SSL}$. Additionally, since it is preferred that $S_{GSL1}$ is approximately equal to $S_{SSL1}$, the preference therefore is that $W_{GSL}/pBL>60$ and $W_{GSL}/S_{GSL1}>24$.

Note that whereas it is preferred that all GSLs have the same width in the bit line direction, and underlie the same number of SSLs in the bit line direction, neither is a requirement for all embodiments.

As used herein, a given value is "responsive" to a predecessor value if the predecessor value influenced the given value. If there is an intervening processing element, step or time period, the given value can still be "responsive" to the predecessor value. If the intervening processing element or step combines more than one value, the signal output of the processing element or step is considered "responsive" to each of the value inputs. If the given value is the same as the predecessor value, this is merely a degenerate case in which the given value is still considered to be "responsive" to the predecessor value. "Dependency" of a given value upon another value is defined similarly.

As used herein, the "identification" of an item of information does not necessarily require the direct specification of that item of information. Information can be "identified" in a field by simply referring to the actual information through one or more layers of indirection, or by identifying one or more items of different information which are together sufficient to determine the actual item of information. In addition, the term "indicate" is used herein to mean the same as "identify".

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. For example, and without limitation, any and all variations described, suggested or incorporated by reference in the Background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A memory device on a substrate, comprising:
   a multilevel stack of conductive layers, each of the layers being oriented parallel to the substrate;
   a plurality of pillars oriented orthogonally to the substrate, each of the pillars comprising a plurality of series-connected memory cells located at cross-points between the pillars and the conductive layers;
   a plurality of string select lines oriented parallel to the substrate and above the conductive layers, each of the string select lines intersecting a respective distinct subset of the pillars, each of the intersections of a pillar and a string select line defining a respective select gate of the pillar, and all of the string select lines in the plurality overlying a single one of the conductive layers; and
   a plurality of parallel bit line conductors in a layer parallel to the substrate and above the string select lines, each of the bit line conductors superposing a respective distinct subset of the pillars, the bit line conductors in the plurality having a pitch pBL, each of the pillars underlying one of the bit line conductors, none of the bit line conductors in the plurality of bit line conductors intersecting more than one of the pillars which underlie a single one of the string select lines,
   wherein the pillars in the plurality of pillars are arranged on a regular grid having two lateral dimensions, the regular grid having a unit cell of four of the pillars A, B, C and D located at vertices of a parallelogram, and all intersecting a single one of the string select lines,
   pillar B being a pillar which is nearest to pillar A in the grid,
   and pillar C being a pillar which is non-collinear with pillars A and B but which is otherwise nearest pillar A in the grid,
   wherein two adjacent ones of the string select lines have respective widths in the bit line direction which are at least as large as ($\alpha$/pBL), $\alpha$ being the area of the unit cell.

2. The memory device of claim 1, wherein the parallelogram is non-rectangular and is oriented such that $\overline{AB}$ is perpendicular to the bit line conductors.

3. The memory device of claim 1, wherein the pillars in the plurality of pillars are arranged on a regular grid having two perpendicular lateral dimensions, neither of the lateral dimensions being parallel to or orthogonal to the bit line conductors.

4. The memory device of claim 1, wherein one of the string select lines has a width in the bit line direction of Wssl,
   and wherein Wssl/pBL$\geq$30.

5. The memory device of claim 4, wherein two adjacent ones of the string select lines each have a width in the bit line direction at least as large as Wssl,
   wherein the two adjacent string select lines are spaced in the bit line direction by a spacing S,
   and wherein Wssl/S$\geq$12.

6. The memory device of claim 1, wherein two adjacent ones of the string select lines each have a width in the bit line direction at least as large as a value Wssl,
   wherein the two adjacent string select lines are spaced in the bit line direction by a spacing S,
   and wherein Wssl/S$\geq$12.

7. The memory device of claim 1, wherein one of the conductive layers completely surrounds each of the pillars laterally that it intersects.

8. The memory device of claim 1,
   wherein each of the conductive layers is divided laterally into a set of at least one word line;
   further comprising a plurality of ground select lines disposed below the conductive layers, each of the ground select lines intersecting a respective distinct subset of the pillars, each of the intersections of a pillar and a ground select line defining a respective ground select gate of the pillar, a number $N_{GSL}>1$ of the ground select lines underlying a first one of the word lines,
   wherein a number $N_{SSLG}$ of the string select lines superposes a first one of the ground select lines;

and wherein two adjacent ones of the ground select lines which underlie the first word line have respective widths in the bit line direction which are at least as large as ($\alpha$/pBL), $\alpha$ being the area of the unit cell.

9. The memory device of claim 8, wherein the number $N_{GSL}$ of the ground select lines underlying the first word line is between 1 and the number $N_{SSL}$ of the string select lines superposing the first word line, exclusive.

10. A memory device on a substrate, comprising:
a multilevel stack of conductive layers, each of the layers being divided laterally into a set of at least one word line;
a plurality of pillars oriented orthogonally to the conductive layers, each of the pillars comprising a plurality of series-connected memory cells located at cross-points between the pillars and the conductive layers;
a plurality of string select lines disposed above the conductive layers, each of the string select lines intersecting a respective distinct subset of the pillars, each of the intersections of a pillar and a string select line defining a respective string select gate of the pillar, a number $N_{SSL}$ of the string select lines superposing a first one of the word lines;
a plurality of parallel bit line conductors disposed above the string select lines, each of the bit line conductors superposing a respective distinct subset of the pillars, the bit line conductors in the plurality having a pitch pBL, each of the pillars underlying one of the bit line conductors, none of the bit line conductors in the plurality of bit line conductors intersecting more than one of the pillars which underlie a single one of the string select lines; and
a plurality of ground select lines disposed below the conductive layers, each of the ground select lines intersecting a respective distinct subset of the pillars, each of the intersections of a pillar and a ground select line defining a respective ground select gate of the pillar, a number $N_{GSL}$ of the ground select lines underlying the first word line,
wherein the pillars in the plurality of pillars are arranged on a regular grid having two lateral dimensions, the regular grid having a unit cell of four of the pillars A, B, C and D located at vertices of a parallelogram, and all intersecting a single one of the ground select lines,
pillar B being a pillar which is nearest to pillar A in the grid,
and pillar C being a pillar which is non-collinear with pillars A and B but which is otherwise nearest pillar A in the grid,
wherein two adjacent ones of the ground select lines which underlie one of the conductive layers have respective widths in the bit line direction which are at least as large as ($\alpha$/pBL), $\alpha$ being the area of the unit cell.

11. The memory device of claim 10, wherein the number $N_{GSL}$ of the ground select lines underlying the first word line is between 1 and the number $N_{SSL}$ of the string select lines superposing the first word line, exclusive.

12. The memory device of claim 10, wherein the parallelogram is non-rectangular and is oriented such that $\overline{AB}$ is perpendicular to the bit line conductors.

13. The memory device of claim 10, wherein the pillars in the plurality of pillars are arranged on a regular grid having two perpendicular lateral dimensions, neither of the lateral dimensions being parallel to or orthogonal to the bit line conductors.

14. The memory device of claim 10, wherein one of the ground select lines has a width in the bit line direction of Wgsl,
and wherein Wgsl/pBL≥60.

15. The memory device of claim 14, wherein two adjacent ones of the ground select lines each have a width in the bit line direction at least as large as Wgsl,
wherein the two adjacent ground select lines are spaced in the bit line direction by a spacing Sgsl1,
and wherein Wgsl/Sgsl1≥24.

16. The memory device of claim 10, wherein two adjacent ones of the ground select lines each have a width in the bit line direction at least as large as a value Wgssl,
wherein the two adjacent ground select lines are spaced in the bit line direction by a spacing Sgsl1,
and wherein Wgsl/Sgsl1≥24.

17. The memory device of claim 10, wherein one of the conductive layers completely surrounds each of the pillars laterally that it intersects.

* * * * *